US006266735B1

(12) United States Patent
Isobe

(10) Patent No.: US 6,266,735 B1
(45) Date of Patent: *Jul. 24, 2001

(54) INFORMATION PROCESSING SYSTEM

(75) Inventor: Tadaaki Isobe, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/488,703

(22) Filed: Jan. 21, 2000

Related U.S. Application Data

(63) Continuation of application No. 08/934,064, filed on Sep. 19, 1997.

(30) Foreign Application Priority Data

Sep. 20, 1996 (JP) ...................................... 8-249721

(51) Int. Cl.[7] ...................................................... G06F 8/00
(52) U.S. Cl. .............................. 711/5; 713/300; 365/227; 365/230.3; 365/210
(58) Field of Search ............................... 711/5, 204, 220; 368/113; 712/36; 365/210, 227, 230.3, 236

(56) References Cited

U.S. PATENT DOCUMENTS

| 5,548,739 | 8/1996 | Yung ..................................... 711/204 |
| 5,708,842 | 1/1998 | Ikegaya et al. ......................... 712/36 |
| 5,717,659 | 2/1998 | Besesty . | |
| 5,765,219 | 6/1998 | Densham et al. ..................... 711/220 |
| 5,778,416 | 7/1998 | Harrison et al. .......................... 711/5 |

OTHER PUBLICATIONS

Kai Hwang, "Advanced Computer Architecture: Parallelism, Scalability, Programmability," McGraw–Hill, Inc. pp. 403–413.

Nakamura et al., "Proposal of Pseudo Vector Processor in Super Scalar Scheme and Register Window," Parallel Processing Symposium, JSPP, 1992, Papers pp. 367–374.

Primary Examiner—Do Hyun Yoo
Assistant Examiner—Nasser Moazzami
(74) Attorney, Agent, or Firm—Antonelli, Terry, Stout & Kraus, LLP

(57) ABSTRACT

In an information processing system, a main storage access request issued from a processor is input to an access buffer mechanism provided in a memory control device, and sent via an operation request issue control mechanism to a main storage device constituted of a plurality of memory units (banks). In the memory control device, the operation status of each bank constituting the main storage device is managed and the number of banks under operation is counted. The predetermined number (operation bank limit number) of banks required to operate at a minimum is compared with the number (operation bank number) of banks under operation. If the operation bank number is smaller than the operation bank limit number, the memory control device instructs a dummy operation request generation mechanism to generate a dummy operation request, in order to prevent a large change in a power supply current to be caused by an abrupt change in the number of access requests to the main storage device and to realize a system stable operation. A dummy operation request generation mechanism determines a bank which executes a dummy operation, and an operation request issue control mechanism issues a dummy operation request to the determined bank in the main storage device.

23 Claims, 12 Drawing Sheets

FIG. IIA, FIG. IIB, FIG. IIC, FIG. IID, FIG. IIE, FIG. IIF, FIG. IIG, FIG. IIH

INFORMATION PROCESSING SYSTEM

This is a continuation of parent application Ser. No. 08/934,064, filed Sep. 19, 1997, allowed.

BACKGROUND OF THE INVENTION

The present invention relates to an information processing system, and more particularly to an information processing system having a storage device constituted of a plurality of independently operating memory units (banks), capable of stabilizing the system operation by minimizing a change in power source current during operation and by controlling the issue of access requests.

In a system which processes technical calculations at high speed, it is important how data transfer between an arithmetic unit and a storage unit storing an immense volume of data is executed at high speed. For speeding up data transfer, a so-called cache memory mechanism has been incorporated in which frequently accessed data is registered in a high speed buffer (cache memory). This mechanism speeds up data transfer by utilizing localization of data stored in the memory unit to be accessed by a processor.

Generally, this cache memory mechanism considerably improves the system performance. However, if the scale (data amount) of each event to be processed becomes large, data overflows from the cache memory so that the performance of an arithmetic unit cannot be fully used. This data overflow can be solved if the capacity of a cache memory is large (e.g., if a memory unit having a large capacity are used or a number of memory units are used). There is a tradeoff, however, that high speed access to the cache memory becomes insufficient. High speed processing of the system cannot be expected by this approach.

In order to solve the above problem from the system architecture side, a computer system architecture independent from a cache memory has been proposed. A typical architectures is called a "vector processor scheme". With this architecture, data is directly transferred at high speed between a main storage device and a vector register having a large capacity which holds a plurality of consecutive elements in a "column direction" or "row direction" to be used for array calculation. This architecture is disclosed, for example, in Kai Hwang, "ADVANCED COMPUTER ARCHITECTURE: Parallelism, Scalability, Programmability", McGraw-Hill, Inc., pp. 403–414. Another example of such an architecture is a "pseudo vector processing scheme" which is disclosed, for example, in Nakamura et al "Proposal of Pseudo Vector Processor in Super Scalar Scheme and Register Window", Parallel Processing Symposium, JSPP, 1992, Papers pp. 367–374. In this architecture, the number of registers in a standard processor is increased, and each iteration of a "DO loop" as in a FORTRAN program is processed by shifting a group of currently processing registers (a register area defined as processing registers is called a window). Namely, general registers are used by sequentially shifting a window of currently processing registers on a number of registers as if they are vector registers.

In a vector processing method such as the vector processor scheme and pseudo vector processing scheme, the types of access to a main storage device are greatly different from a computer system of a cache memory base. Namely, in the system of a cache memory base, an access to a main storage device is performed in the unit of "block" or "line" which is a registration unit of the cache memory. This size is in the range from several tens to several hundreds of bytes, and an access to the main storage device is a continuous area access. On the other hand, in the vector processing method, data of 8 bytes (in most cases, the unit of 8 bytes as double precision data is used) is transferred to and from a register. In the vector processing method, therefore, it is necessary for the main storage device side to adopt an architecture capable of accessing a large amount of data of the 8-byte unit at high speed.

In order to realize such an architecture in a vector processing system, a main storage device is generally provided with a plurality of independently operating memory units (called banks) having a 8-byte width or the like. A "bank number" is sometimes expressed as an "interleave-way number". Although this bank number depends on a performance to be achieved by a system, there are systems having banks of several tens to several thousands.

A new factor other than the performance of a computer system is becoming an object of recent studies and developments. This factor is mainly related to low energy consumption, and a system which can realize a proper performance with a proper energy amount has been desired to be developed. With this recent development trend, CMOS LSIs are often used for high performance systems. Rapid advent of recent studies on CMOS LSIs has led to high operation speeds of CMOS LSIs with relatively low prices. This low price of LSIs constituting a computer system allows not only high-speed/high-price SRAMs but also middle-speed/low-price DRAMs to be used as memory elements of a main storage device, even in a system of the above-described "vector processing scheme".

One problem of a main storage device of a multi-bank structure made of DRAMs is a large change in power supply current of DRAMs. Generally, because of high speed operations characteristic to SRAMs, their current consumption amount even during a non-access state (standby state) operation does not change greatly from that during an access state (operation state).

In contrast, the current consumption amount of DRAM changes greatly between the non-access state and access state. In some cases, the current amount may change by about three digits. A large change in the current amount between both the states poses one problem. This problem lies in the main storage access characteristics specific to the "vector processing scheme", namely an abrupt change from a preparatory stage before vector processing with less accesses to the main storage to a stage during vector processing with frequent accesses to the main storage. Such a quick rise of accesses in the "vector processing scheme" causes a number of banks to change at the same time from the non-access state to the access state. A power supply current to DRAMs therefore increases abruptly. For example, a power supply current to one DRAM is about 100 mA in the access state. If the operation states of DRAMs of several hundreds to several thousands change at the same time, a power supply current of several tens to several hundreds of ampere is supplied to the main storage device. This becomes a critical issue of a power supply system of the main storage device, because this system cannot respond at once to such an instantaneous large current change. Generally, a load change response characteristics of a power source relative to electronic circuits are in the order of $\mu$s at the faster level. This time is determined depending upon inductance and resistance components in the circuit path from the power source to the electronic circuits.

A relationship between a power source, a power supply system and an electronic circuit group is illustrated in FIG.

12 by using a model of the power supply system. In FIG. 12, current is supplied from a power source 1101 to an electronic circuit group such as an LSI 1104 and a DRAM 1105 via a mother board 1102 and a package 1103. An equivalent circuit of the power supply system is represented by inductance components 1110, 1113 and 1116 and resistance components 1111, 1114 and 1117 which are connected in series with the electronic circuit group, and by capacitance components 1112 and 1115 or the like which are connected in parallel to the electronic circuit group.

If the power supply system has a narrow wiring pattern and has large inductance components, the response time prolongs. During a response period, the amount of current supplied via the power supply system becomes insufficient so that in a simple case, the voltage applied to the electronic circuit group lowers. A general countermeasure for dealing with a temporary change in the current amount to be caused by a load change, is to replace the capacitors 1112 and 1115 shown in FIG. 12 by capacitors having a large capacitance. The operation mechanism of the capacitors is as follows. In a normal operation state, electric charges are stored in the capacitors, and when a large change in the load current occurs, the charges are discharged from the capacitors and supplied to the electronic circuit group in order to compensate for insufficient energy until the power supply system responds.

An instantaneous change in the power supply current can be suppressed in most cases by providing such capacitors. However, in the case of a large current change amount, the capacitance of capacitors necessary for compensating for such an amount becomes very large. For example, if a voltage fluctuation is to be suppressed to 0.3 V at a current change of 100 A, a necessary capacitance is 3.3 mF. If a 3.3 $\mu$F capacitor usually mounted on a substrate is used, 1000 capacitors are required assuming that the electric characteristics thereof are ideal. The total capacitance "C-total" can be obtained from the following equation, where "$\Delta V$" is an allowable voltage fluctuation amount, "$\Delta I$" is a current change amount, and "Ta" is a time while the current changes.

$$C\text{-total}=\Delta I \times Ta/\Delta V$$

From another viewpoint of computer systems, it is necessary to avoid unnecessary current consumption in order to meet recent strong requirements of low energy consumption of computer systems. In this case, if transition from a low power mode to a high speed mode takes a long time, it is not possible to realize a high speed performance of computer systems. A system satisfying both low power and high performance requirements, which requirements contradict with each other in terms of recent technology, is desired to be configured. From this viewpoint, it is necessary to realize a high speed access mechanism of suppressing a change amount of power supply current while providing both high speed performance and low power consumption.

SUMMARY OF THE INVENTION

It is an object of the present invention to provide an information processing system capable of stabilizing the system operation by maintaining a predetermined amount of current even in a non-access state so that a power supply current amount does not change greatly upon an abrupt rise of the number of accesses to a storage device.

It is another object of the present invention to provide an information processing system capable of making a power supply current change gently even if the number of accesses to a storage device changes, and avoiding an excessive power consumption while the number of accesses is small.

In order to achieve the above objects, an information processing system of this invention having a processor, a memory control device, and a storage device including a plurality of independently operating memory units (banks), comprises: means for storing the number (hereinafter called operation bank limit number) of banks in the storage device required to operate at a minimum; means for counting the number (hereinafter called operation bank number) of banks under operation in the storage device; and means for instructing the storage device to execute a dummy operation if the operation bank number is smaller than the operation bank limit number.

Further, an information processing system of this invention having a processor, a memory control device, and a storage device including a plurality of independently operating memory units (banks), comprises: means for storing the number (operation bank limit number) of banks in the storage device required to operate at a minimum; means for counting the number (operation bank number) of banks under operation in the storage device; means for instructing the storage device to execute a dummy operation if the operation bank number is smaller than the operation bank limit number, and inhibiting an issue of a succeeding normal access request to the storage device if the operation bank number becomes larger than the operation bank limit number; and means for increasing the value of the operation bank limit number if even a single dummy operation request is not issued during a predetermined period and decreasing the value of the operation bank limit number if at least one dummy operation request is issued during the predetermined period, respectively at an interval of the predetermined period.

Furthermore, the information processing system may further comprise means for invalidating an issue of a dummy operation request to the storage device or an issue of a succeeding normal access request to the storage device, in accordance with the process contents of the processor.

The storage device instructed to execute the dummy operation executes a current consumption operation without destructing information stored in the storage device. If DRAMs are used as the storage device, the refresh operation is executed for the current consumption operation. Alternatively, a switch to the power source is provided in a memory cell unit constituting the storage device or near at a power source terminal of a memory cell unit, and when a dummy operation instruction is detected, the switch is closed to flow current to and from the power source.

The following effects are expected according to the information processing system of this invention.

(1) The operation bank limit number is predetermined, and if the operation bank number is the operation bank limit number or smaller, a dummy operation is performed. Accordingly, it is possible to always operate banks more than the operation bank limit number and to suppress a change in a power supply current.

(2) If the operation bank limit number is dynamically changed in accordance with the number of access requests, a consumption current amount can be made to change gently. Even if the number of access requests is small, excessive power consumption to be caused by dummy operation can be avoided.

(3) If means is provided for enabling, when necessary, a mechanism for controlling a change in a power supply current amount, the mechanism can be used only during a long access concentration period. Accordingly, a change in a power supply current amount can be suppressed without degrading the system performance.

(4) Even if a high speed access mechanism is realized in a system using DRAMs as its storage device, it is possible to suppress a change in a power source voltage by a change in a power supply current amount. Accordingly, a system with a stable operation can be provided.

BRIEF DESCRIPTION OF THE DRAWINGS

FIG. 11 is a timing chart illustrating how a dummy request is generated in the embodiment shown in FIG. 1.

DESCRIPTION OF THE PREFERRED EMBODIMENTS

Figure 1:
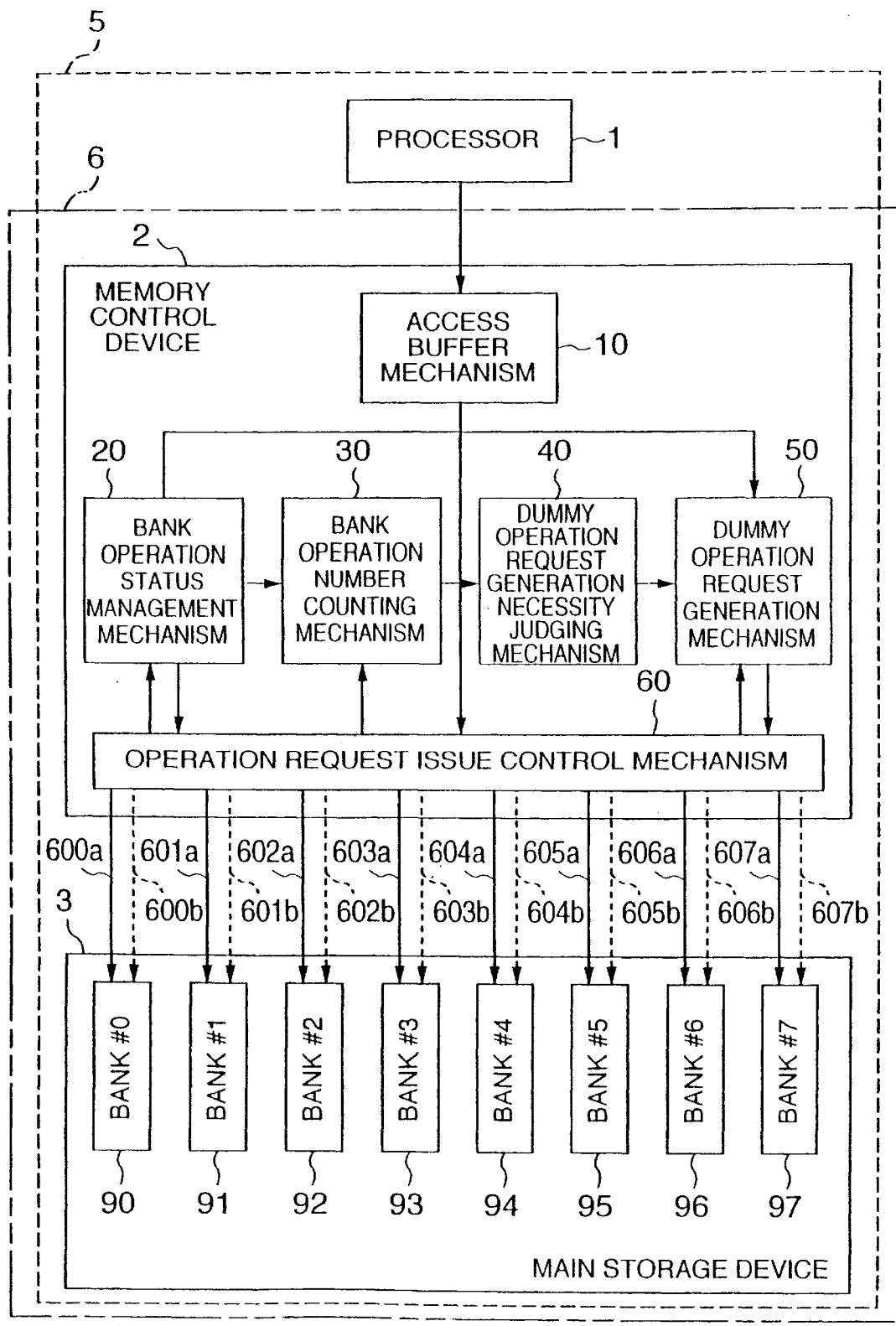
FIG. 1 is a block diagram showing an example of the overall structure of an information processing system according to a first embodiment of the invention.

FIG. 1 shows the overall structure of an information processing system according to the first embodiment of the invention. This system includes a processor 1, a memory control device 2 and a main storage device 3. Referring to FIG. 1, the memory control device 2 has an access buffer mechanism 10, a band operation status management mechanism 20, a bank operation number counting mechanism 30, a dummy operation request generation necessity judging mechanism 40, a dummy operation request generation mechanism 50 and an operation request issue control mechanism 60. In this embodiment, the main storage device 3 is constituted of independently operating eight memory units (banks) 90 to 97.

A request for an access to the main storage device issued by the processor 1 is input to the access buffer mechanism 10 of the memory control device 2, and sent via the operation request issue control mechanism 60 to the main storage device 3. The operation request issue control mecha-nism 60 controls the issue of a request for an access to each of the banks 90 to 97 constituting the main storage device 3, while transferring necessary signals to and from the bank operation status management mechanism 20, bank operation number counting mechanism 30 and bank operation number counting mechanism 50. Each of the banks 90 to 97 constituting the main storage device 3 executes data read/write of memory cells of its bank, in response to a corresponding one of normal access request signals 600a to 607a sent from the operation request issue control mechanism 60, and also executes a dummy operation for increasing current consumption in its bank, in response to a corresponding one of dummy request signals 600b to 607b sent from the operation request issue control mechanism 60.

An execution instruction of the dummy operation is generated by the following procedure. As will be described later, the bank operation status management mechanism 20 manages the operation status of each of the banks 90 to 97 constituting the main storage device 3, by receiving normal requests 620a to 627a and their operation cycle numbers. The bank operation number counting mechanism 30 receives operation status information (210a to 217a) on each bank regarding the already issued requests from the bank operation status management mechanism 20, and also receives normal access request information (610a to 617a) on each bank regarding the requests presently determined to be issued, from the operation request issue control mechanism 60. In accordance with the received information, the bank operation number counting mechanism 30 judges the number of banks already operating and to be operated (both types of banks are collectively called banks under operation).

The dummy operation request generation necessity judging mechanism 40 compares the number (bank operation number) of banks under operation supplied from the bank operation number counting mechanism 30 with the predetermined number (operation bank limit number) of banks required to operate at a minimum, to thereby judge whether a dummy operation is necessary.

If the bank operation number is smaller than the operation bank limit number, the dummy operation request generation necessity judging mechanism 40 instructs the dummy operation request generation mechanism 50 to issue a dummy operation request.

The dummy operation request generation mechanism 50 receives from the bank operation status management mechanism 20 the operation status information on each bank regarding the already issued request, and also receives from the operation request issue control mechanism 60 the normal access request information on each bank regarding the request presently determined to be issued. In accordance with these received information, the dummy operation request generation mechanism 50 determines, in response to an instruction of issuing a dummy operation request, one dummy request to be supplied to one bank other than those banks already operating or determined to operate, and instructs the operation request issue control mechanism 60 to send one dummy operation request.

In the above manner, the memory control device 2 compares the bank operation number with the operation bank limit number, i.e., the minimum number of banks required to operate among all the banks 90 to 97 constituting the main storage device 3. If the bank operation number is small, the main storage device 3 is instructed to execute a dummy operation so that the number of banks under operation can be maintained to be a constant number (limit number) or larger.

Figure 2:
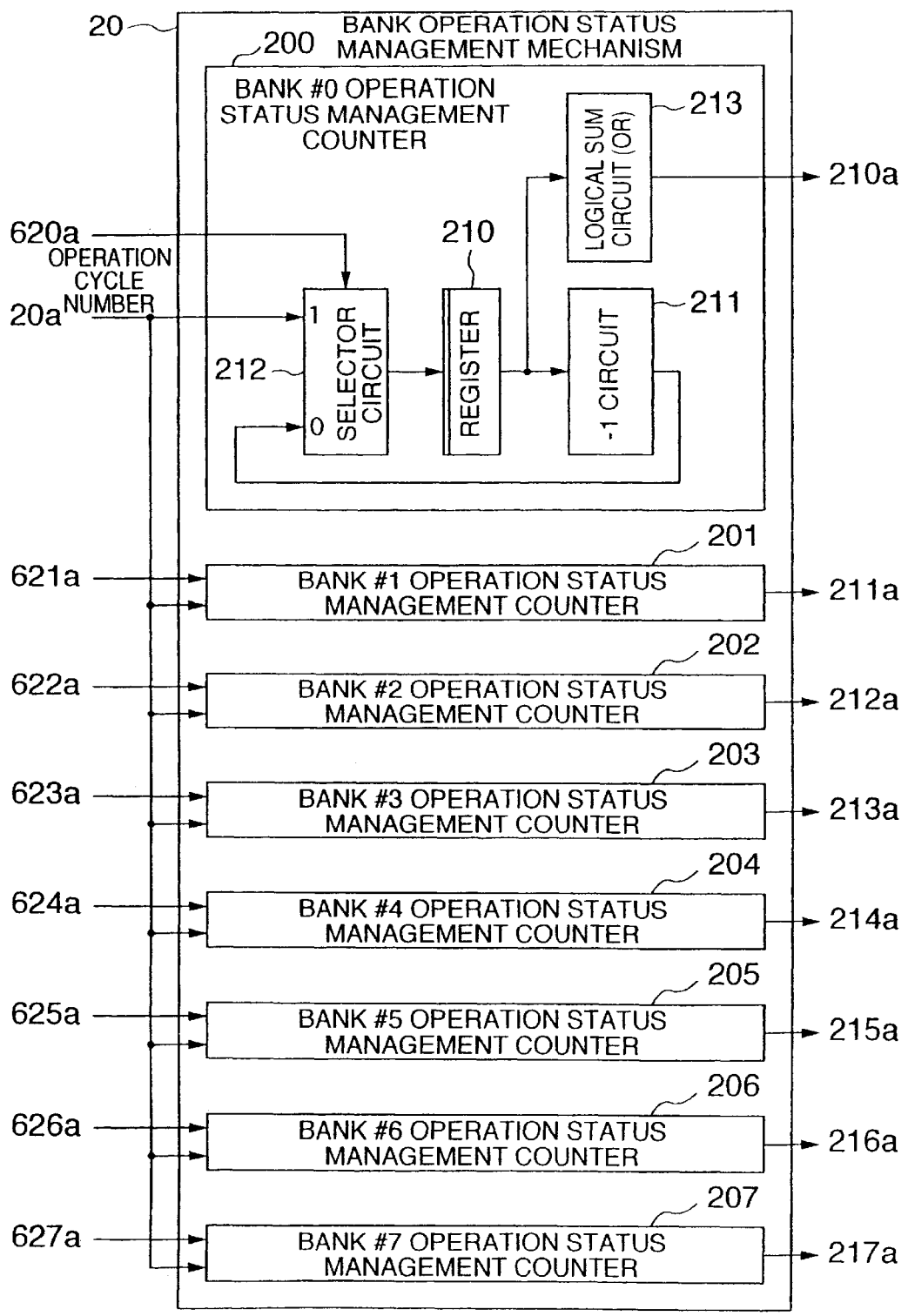
FIG. 2 is a block diagram showing an example of the detailed structure of a bank operation status management mechanism.

FIG. 2 shows an example of the detailed structure of the bank operation status management mechanism 20. The bank operation status management mechanism 20 is provided with counters 200 to 207 which manage the operation status (busy state) of the corresponding banks 90 to 97. The operation of each counter will be described taking as a typical example the counter 200 corresponding to the bank (#0) 90. The operation status management counter 200 is constituted of a register 210, a "−1" circuit (ensuring "0" or larger) 211, a selector circuit 212 and a logical sum circuit (OR) 213.

At the same timing when a request 600a is issued from the operation request issue control mechanism 60 to the main storage device 3, in response to the signal 620a, an operation (busy) cycle number of the main storage device 3 when the request is issued is set to the register 210 via a busy cycle number signal line 20a and the selector circuit 212. The value set to the register 210 is passed through the "−1" circuit 211 and selector circuit 212 and decremented by "−1" each cycle until the value becomes "0". If the value of the register 210 is "1" or larger, it is possible to judge that the bank (#0) 90 is busy.

An OR signal of all bits of a count loaded in the register 210 is generated by the OR circuit 213 and output as a bank operation status signal 210a. This signal 210a takes "1" if the bank (#0) 90 is busy, and "1" if it is not busy. The operations of the operation status management counters 201 to 207 corresponding to the banks (#1) 91 to (#7) 97 are similar to the above. The bank operation status signals 210a to 217a for the banks are supplied as bank operation status information to the bank operation number counting mechanism 30, dummy operation request generation mechanism 50 and operation request issue control mechanism 60. The bank operation status management mechanism 20 pseudorealistically generates the operation status of each bank in accordance with the request signals sent to the main storage device 3.

Figure 3:
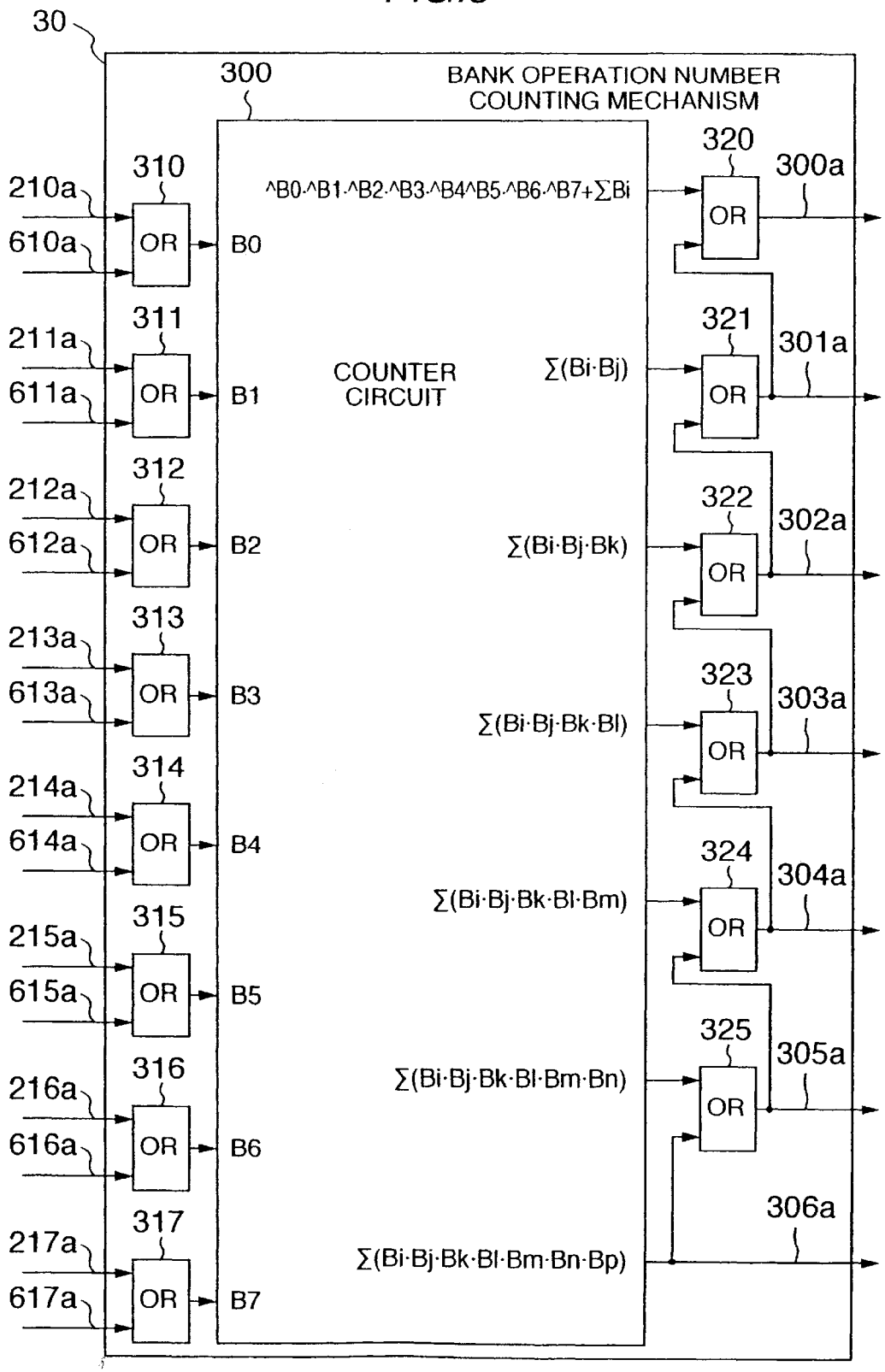
FIG. 3 is a diagram showing an example of the detailed structure of a bank operation number counting mechanism.

FIG. 3 shows an example of the detailed structure of the bank operation number counting mechanism 30. OR circuits 310 to 317 are provided in correspondence with the banks. Input to this bank operation number counting mechanism 30 are the bank operation status information 210a to 217a from the bank operation status management mechanism 20 and the information on the requests of normal accesses to the main storage device 3 excepting the dummy operation requests from the operation request issue control mechanism 60. The OR circuits 310 to 317 combine the information 210a to 217a on the banks already accessing the main storage device with the information 610a to 617a on the banks determined during the subject cycle to access the main storage device upon the normal access requests. The combined information defined as B0 to B7 is input to a counter circuit 300. The signals B0 to B7 take "1" if the corresponding bank is busy, and "0" if not.

The counter circuit 300 detects the operation bank number of the main storage device as in the following:

$\hat{B}0 \cdot +e,cir +ee\ B1 \cdot +e,cir +ee\ B2 \cdot +e,cir +ee\ B3 \cdot +e,cir +ee\ B4 \cdot +e,$
$cir +ee\ B5 \cdot +e,cir +ee\ B6 \cdot +e,cir +ee\ B7 + \Sigma Bi:$ the operation bank number is "0" or "1".
$\Sigma$ (Bi·Bj): the operation bank number is "2".
$\Sigma$ (Bi·Bj·Bk): the operation bank number is "3".
$\Sigma$ (Bi·Bj·Bk·Bl): the operation bank number is "4".
$\Sigma$ (Bi·Bj·Bk·Bl·Bm): the operation bank number is "5".
$\Sigma$ (Bi·Bj·Bk·Bl·Bm·Bn): the operation bank number is "6".
$\Sigma$ (Bi·Bj·Bk·Bl·Bm·Bn·Bp): the operation bank number is "7".

$\hat{B}i$ (i=0 to 7) means an inversion of Bi.

Outputs of the counter circuit 300 are input to OR circuits 320 to 325 to generate signals (bank operation signals) 300a to 306a representing bank operation numbers. These signals 300a to 306a have the following meaning.

300a: the bank operation number is "1" or smaller.
301a: the bank operation number is "2" or smaller.
302a: the bank operation number is "3" or smaller.
303a: the bank operation number is "4" or smaller.
304a: the bank operation number is "5" or smaller.
305a: the bank operation number is "6" or smaller.
306a: the bank operation number is "7" or smaller.

In this embodiment, if one of the signals 300a to 306a representing one bank operation number takes "1", all the other signals representing bank operation numbers smaller than the one bank operation number take "1" and the remaining signals take "0". For example, if the signal 303a representing a bank operation number "4" takes "1", the other signals 300a to 302a take "1" and the remaining signals 304a to 306a take "0".

These bank operation number signals 300a to 306a are supplied to the dummy operation request generation necessity judging mechanism 40.

Figure 4:
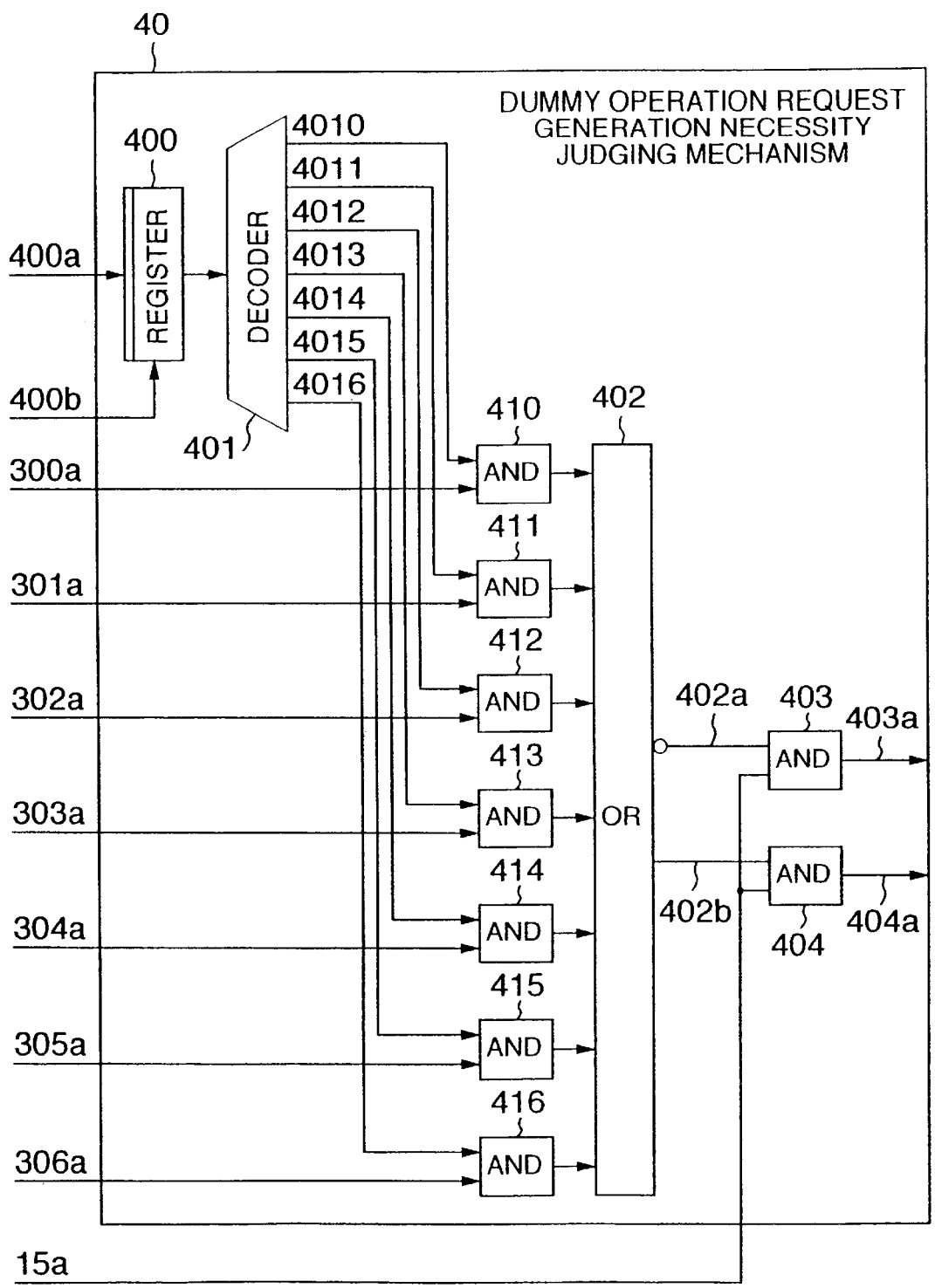
FIG. 4 is a block diagram showing an example of the detailed structure of a dummy operation request generation necessity judging mechanism.

FIG. 4 shows an example of the detailed structure of the dummy operation request generation necessity judging mechanism 40. A register 400 holds the predetermined number (operation bank limit number) of banks required to operate at a minimum. Although not shown in FIG. 1, one of the values "1" to "7" is preset to this register 400 by the processor 1 via a signal line 400a at a set timing carried on a set signal line 400b. The value set to the register 400 is decoded by a decoder 401 which outputs "1" on a signal line corresponding to the value set to the register 400 and "0" on the other signal lines.

The decoded results 4010 to 4016 (corresponding to "1" to "7") and the bank operation number signals 300a to 306a from the bank operation number counting mechanism 30 are input to logical product (AND) circuits 410 to 416. The outputs of the AND circuits 410 to 416 are OR-ed by an OR circuit 402. An inverted output 402a of the OR circuit 402 and a current change suppression signal 15a are input to an AND circuit 403 which in turn outputs a dummy operation generation request signal 403a. An ordinary output 402b of the OR circuit 402 and the current change suppression signal 15a are input to another AND circuit 404 which in turn outputs an access request inhibition signal 404a.

As will be described later, in response to an instruction from the processor 1, the current change suppression signal 15a takes "1" if a current change suppression operation of the system is made valid, and "0" if not. It is assumed here that the signal 15a is preset with "1". Namely, it is assumed in this embodiment that a mechanism of suppressing an abrupt change in the power supply current of the main storage device is always operating.

If the bank operation number is smaller than the operation bank limit number set to the register 400, "1s" are not input to the two input terminals of any one of the AND circuits 410 to 416, so that all the outputs of the AND circuits 410 to 416 are "0". Therefore, the inverted output 402a of the OR circuit 402 takes "1" and the AND circuit 403 outputs the dummy operation generation request signal 403a.

Conversely, if the bank operation number is equal to or larger than the operation bank limit number set to the register 400, an output of the AND circuit corresponding to the band operation number among the AND circuits 410 to 416 takes "1". Therefore, the inverted output 402a of the OR circuit 402 takes "0" to inhibit the dummy operation generation request signal 403a. In this case, since the output 402b of the OR circuit 402 is "1", the access request inhibition signal 404a is output from the AND circuit 404.

The dummy operation generation request signal 403a is supplied to the dummy operation request generation mechanism 50 to instruct a dummy operation, because the bank operation number is smaller than the bank operation limit number set to the register 400. Although not used in the embodiment shown in FIG. 1, the access request inhibition signal 404a may be supplied, as will be described later, to the operation request issue control mechanism 60 to inhibit a succeeding request for access to the main storage device 3, because the bank operation number is larger than the bank operation limit number set to the register 400.

Figure 5:
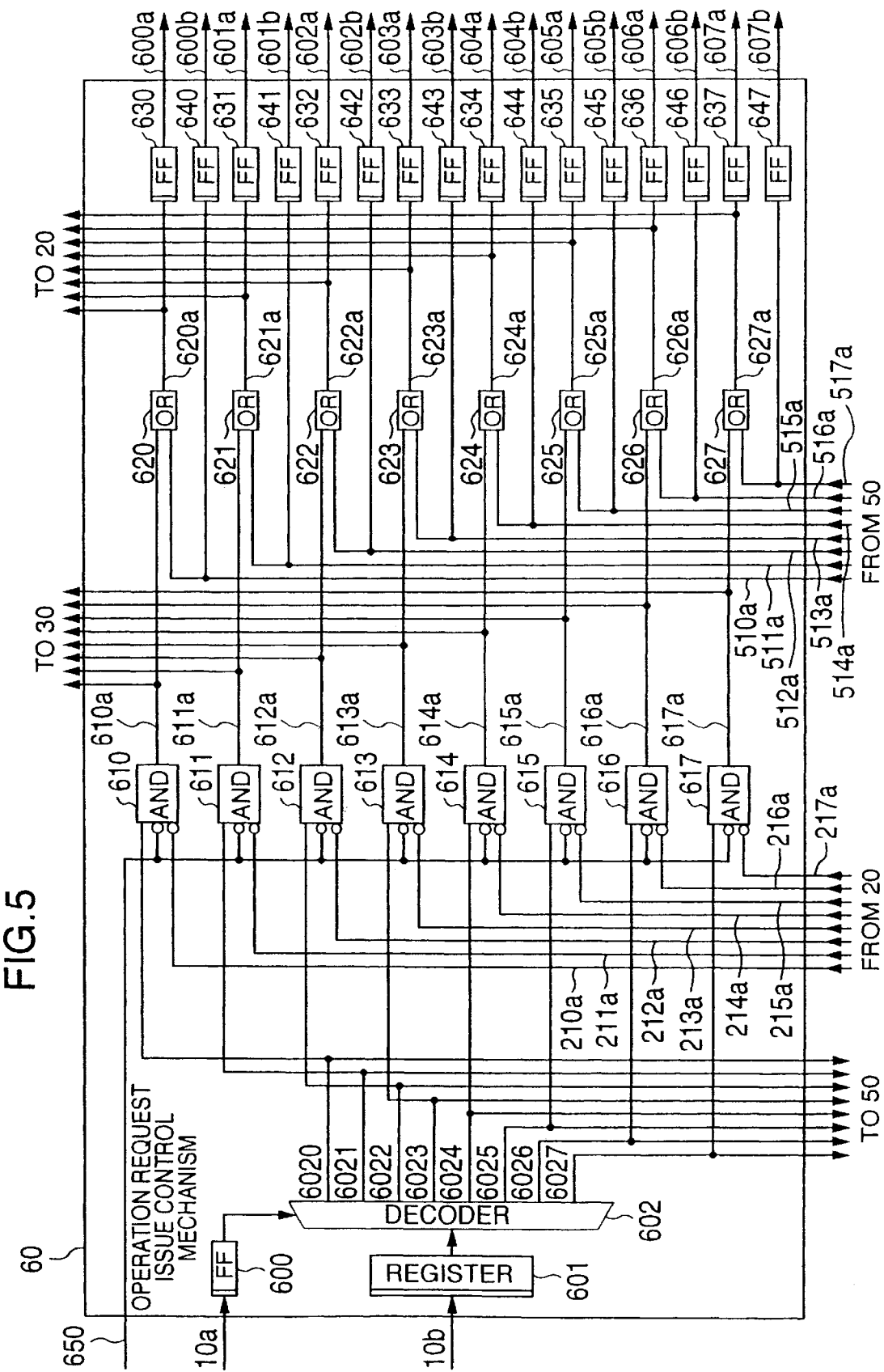
FIG. 5 is a block diagram showing an example of the detailed structure of an operation request issue control mechanism.
Figure 6:
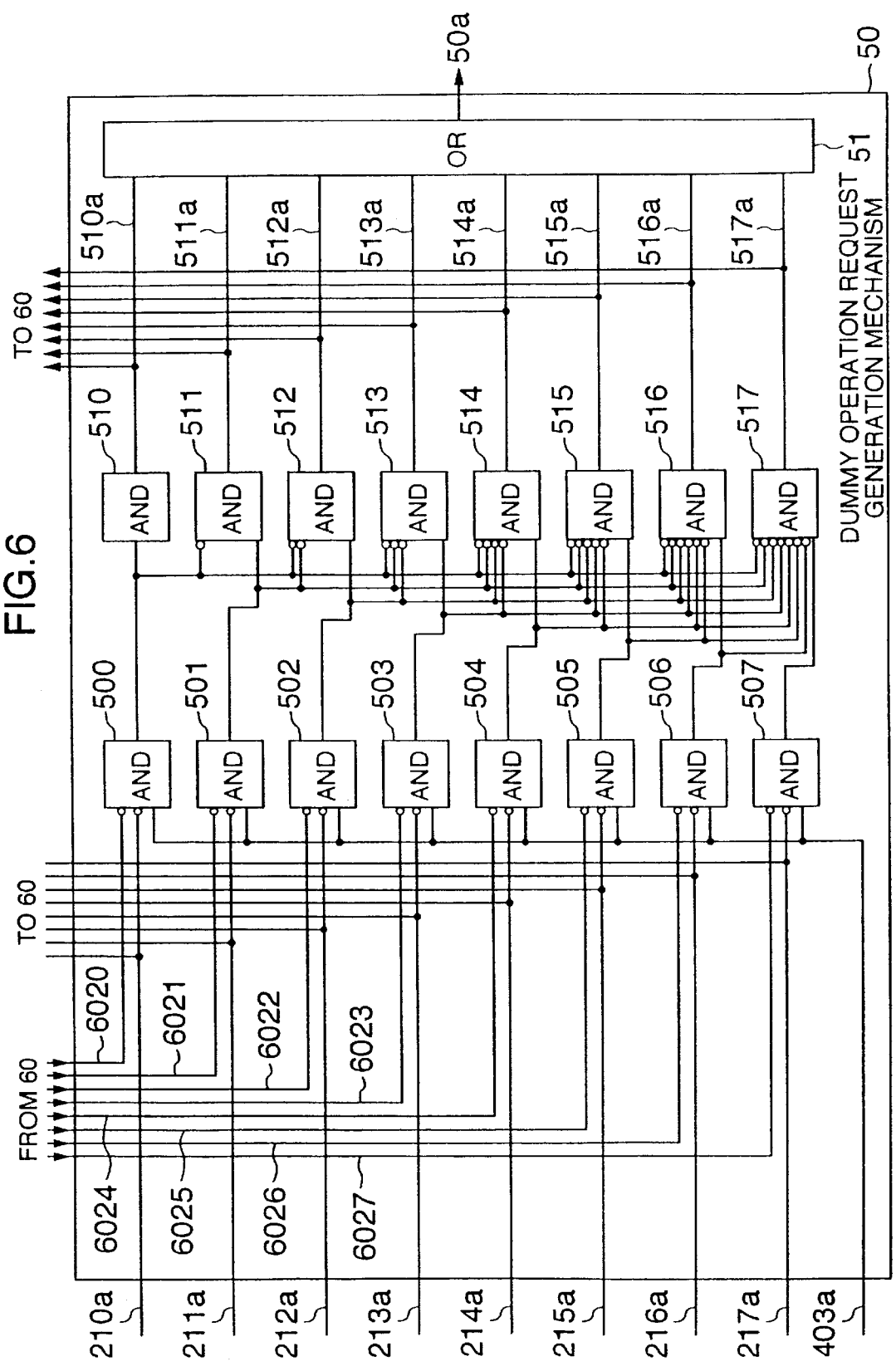
FIG. 6 is a block diagram showing an example of the detailed structure of a dummy operation request generation mechanism.

FIGS. 5 and 6 show examples of the detailed structures of the operation request issue control mechanism 60 and dummy operation request generation mechanism 50, respectively.

In the operation request issue control mechanism 60 shown in FIG. 5, in response to an access request supplied from the access buffer mechanism 10, an access request signal is set via a signal line 10a to a flip-flop 600 and bank address information on a bank to be accessed is set via a signal line 10b to a register 601. The bank address information in the register 601 is supplied to a decoder 602 which outputs signals 6020 to 6027 only the signal of which corresponding to the bank to be accessed takes "1".

AND circuits 610 to 617 provided in correspondence with the banks receive the output signals 6020 to 6027 from the decoder 602 and the inverted signals of the bank operation status signal group 210a to 217a representative of a bank busy state from the bank operation status management mechanism 20. The AND circuits 610 to 617 are used for inhibiting an issue of a succeeding normal access request to the busy bank. In this embodiment, an input signal 650 takes always "0" and the operations of the AND circuits 610 to 617 are not affected.

With this arrangement if a succeeding access request is directed to a bank whose signal among the signal group 210a to 217a representing a bank busy state does not take "1", this succeeding access request is allowed to pass through a corresponding one of the AND circuits 610 to 617 provided in correspondence to the banks, so that the signal corresponding to the subject bank among the access request signals 610a to 617a takes "1". In other words, if the succeeding access request is directed to a busy bank, this access request is not allowed to pass through a corresponding one of the AND circuits 610 to 617, and therefore the access request is suspended. The access request passed through a corresponding one of the AND circuits 610 to 617 is combined by a corresponding one of OR circuits 620 to 627 with a dummy request, to thereby set a corresponding one of flip-flops 630 to 637 provided in correspondence with the banks. As a result, a corresponding one of the normal access request signals 600a to 607a takes "1" and the succeeding access request is issued to the corresponding bank of the main storage device 3. If the signal line 650 is connected to the access request inhibition signal 404a, an access request is issued to the main storage device 3 in the similar manner as above only if the access request inhibition signal 404a takes "0".

In the dummy operation request generation mechanism 50 shown in FIG. 6, in response to the dummy operation generation request signal 403a from the dummy operation request generation necessity judging mechanism 40, a dummy operation request is generated for the bank which is not presently busy and to which a succeeding normal access request is not issued. Specifically, AND circuits 500 to 507 provided in correspondence with the banks receive the inverted signals of the bank operation status signal group 210a to 217a representing a bank busy state from the bank operation status management mechanism 20, the inverted signals of the decode output signal group 6020 to 6027 representing a succeeding normal access request from the operation request issue control mechanism 60, and the dummy operation generation request signal 403a. These AND circuits 500 to 507 select a plurality of banks which are not presently busy and are not operated in the next cycle, and the next stage AND circuits 510 to 517 determine one of the selected banks. These AND circuits 510 to 517 constitute a so-called priority order selection circuit. In this embodiment, in determining a bank to which a dummy operation request is issued, the priority order of selecting the bank (#0) is fixedly made high whereas that of selecting the bank (#7) is made low. The priority order is not limited to the embodiment order or a fixed priority order, but the priority order of selecting a bank number for the dummy operation may be dynamically changed.

The dummy operation request signal group 510a to 517a of the AND circuits 510 to 517 is supplied to the operation request issue control mechanism 60 shown in FIG. 5, and supplied to the main storage device 3 via the OR circuits 620 to 627 and flip-flops 630 to 637. At this time, signals (dummy requests) 600b to 607b representative of a dummy operation request are also supplied to the main storage device 3 via flip-flops 640 to 647. If the dummy operation is instructed, the main storage device 3 executes a current consumption operation without destructing information stored in the storage device 3, as will be later described.

With the above-described structures, a dummy operation request other than a normal main storage access request is generated if the operation bank number is smaller than the operation bank limit number. It is therefore possible to always maintain the operations of the banks of the main storage device corresponding in number to the limit number or larger, and therefore to suppress an abrupt change in a power supply current amount of the main storage device. If banks more than the limit number are operating, the dummy operation request is not generated so that an ordinary access is not affected, nor the system performance is lowered.

The above-described operation will be described with reference to the timing chart shown in FIG. 11. It is assumed here that succeeding normal requests waiting for execution will reach in the order shown at (a) in FIG. 11 and that before a time cycle T#1 shown at (h) in FIG. 11 the bank (#2) 212a and the bank (#6) 216a are under operation (busy and to become busy). In FIG. 11, waveforms associated with the dummy operation are added with hatching. The serial number # added to each waveform is a bank number. It is also assumed that the operation bank limit number is "2". Reference numerals with an alphabetical suffix indicated at the left side column correspond to signal lines shown in FIGS. 2 to 6. The number of banks to be accessed by succeeding normal requests shown at (b) in FIG. 11 and the number of banks already operating shown at (c) in FIG. 11 are indicated as a total number thereof during each time cycle at (d) in FIG. 11. When the total bank number shown at (d) in FIG. 11 becomes "1" smaller than the operation bank limit number, a dummy request shown at (e) in FIG. 11 is generated. During the time cycles T7, T11 and T15 while the bank at the bank number #0 is not busy, the bank at the bank number #1 is selected as the bank which executes the dummy operation, and if the bank at the bank number #0 is busy, the bank at the bank number #1 is selected as the bank which executes the dummy operation. As a result, the total of normal and dummy requests are issued as shown at (f) in FIG. 11.

As shown at (g) in FIG. 11, the number of banks under operation inclusive of the dummy operation can therefore be maintained to be the operation bank number "2" or larger.

Figure 7:
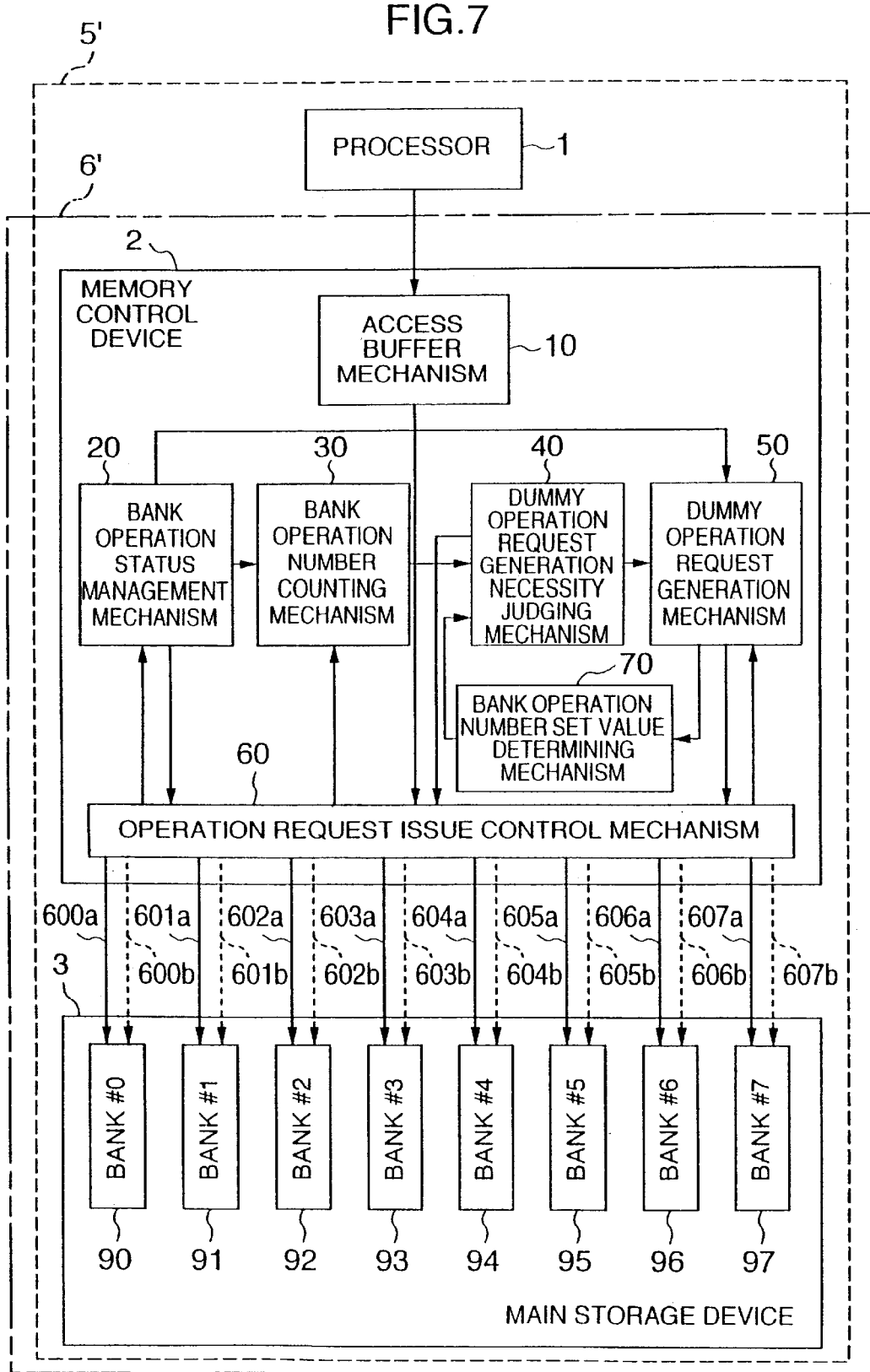
FIG. 7 is a block diagram showing an example of the overall structure of an information processing system according to a second embodiment of the invention.

FIG. 7 is a block diagram showing the overall structure of an information processing system according to the second embodiment of the invention. A first point different from the structure shown in FIG. 1 is the addition of a bank operation number set value determining mechanism 70 to the memory control device 2. The function of the bank operation number set value determining mechanism 70 is to change the set value of the operation bank limit number in accordance with the number of dummy operation requests issued during a predetermined period. No issue of a dummy operation request means an increased number of normal access requests, which leads to a determination to increase the operation bank limit number. An issue of a dummy operation request means a decreased number of normal access requests, which leads to a determination to decrease the operation bank limit number. Such determination can be performed by the bank operation number set. value determining mechanism 70 which upon reception of an issue state of dummy operation requests from the dummy operation request generation mechanism 50, determines at a predetermined time interval the number of banks under operation (operation bank limit number), and supplies this information to the dummy operation request generation necessity judging mechanism 40.

Figure 8:
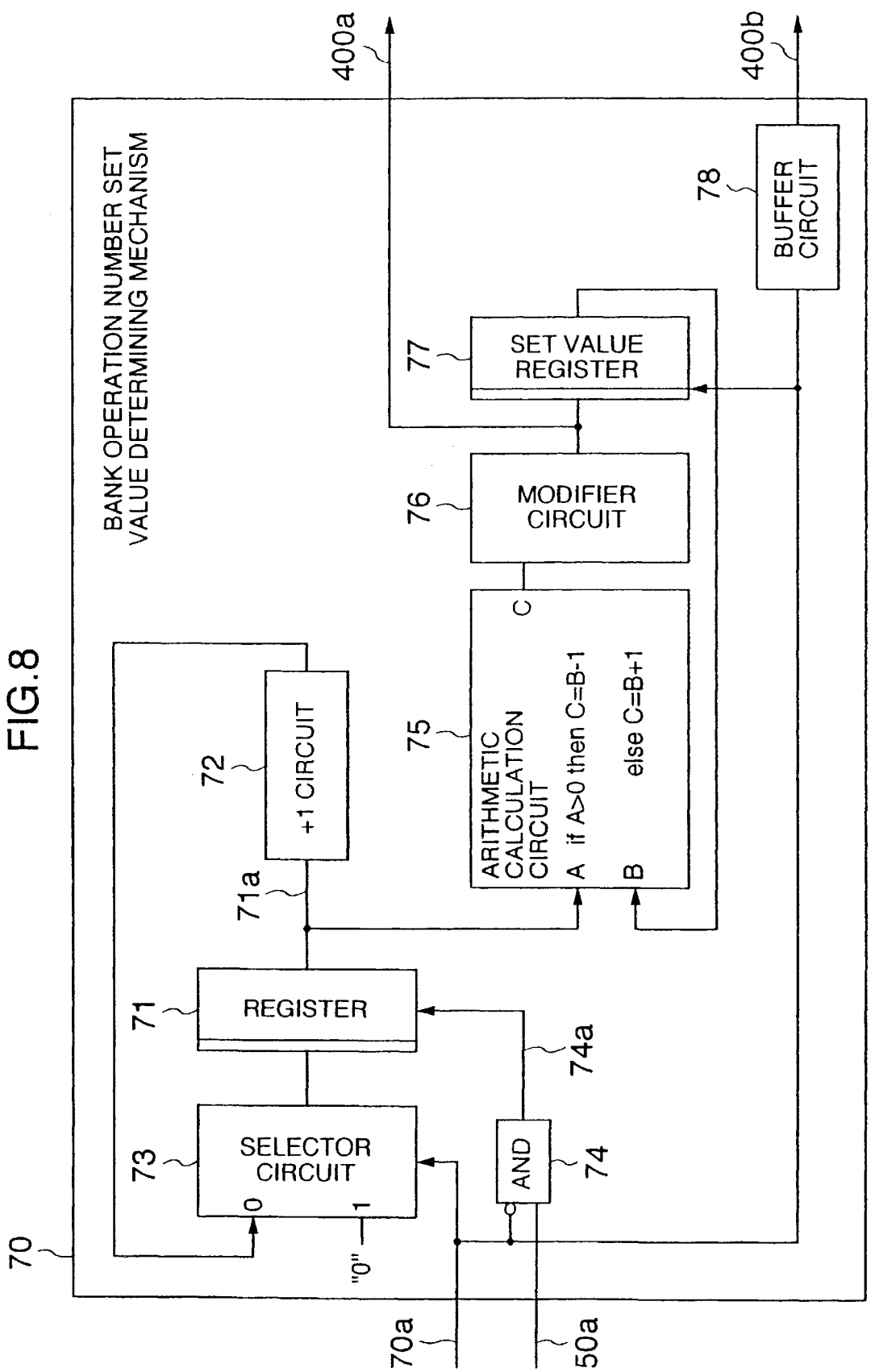
FIG. 8 is a block diagram showing an example of the detailed structure of a bank operation number set value determining mechanism.

FIG. 8 shows an example of the detailed structure of the bank operation number set value determining mechanism 70. Reference numeral 70a represents a reset signal which is periodically supplied at a predetermined time interval from the processor 1 or memory control device 2 although this circuit arrangement is not shown. Reference numeral 77 represents a set value register for storing the operation bank limit number. The processor 1 presets an initial value of this operation bank limit number to the set value register 77. A register 71, a "+1" circuit 72 and a selector circuit 73 constitute a counter. When the reset signal 70a is supplied, the selector circuit 73 selects a value "0" to initialize the register 71.

Thereafter, if the dummy operation issue request signal 50a (refer to FIG. 6) is received from the dummy operation request generation mechanism 50 during the period until the next reset signal 70a is supplied, then a trigger signal 74a is applied via an AND circuit 74 to the register 71 so that the value in the register 71 is incremented with the circuit path of the "+1" circuit 72 and selector circuit 73. An output value 71a of the register 71 is checked by an arithmetic operation circuit 75 whether it is "0" or not. If it is larger than "0", the value in the set value register 77 is decremented by "−1", whereas if it is "0", the value in the set value register 77 is incremented by "+1". The update timing of the contents in the set value register 77 is supplied by the reset signal 70a, and the updated data is transmitted over a signal line 400a. At the same time, a set signal is transmitted via a buffer circuit 70 over a signal line 400b. The above operations are repeated each time the reset signal 70a is supplied.

In the above manner, the operation bank limit number in the register 400 of the dummy operation request generation necessity judging mechanism 40 shown in FIG. 4 can be dynamically changed at a predetermined time interval in accordance with the issue state of dummy operation requests. A circuit 76 shown in FIG. 8 is a modifier circuit for ensuring the upper and lower limit values of the operation bank limit number. For example, this circuit 76 modifies an output of the arithmetic calculation circuit 75 in order to set the output in a range from "8" to "1". The specific structure of this circuit will not be described because it can be realized by using general electronic circuit elements.

Also in the second embodiment shown in FIG. 7, as described in the first embodiment shown in FIG. 1, issuing a normal access request may be suppressed if the number of banks actually operating (bank operation number) becomes larger than the bank operation number set value (operation bank limit number). Specifically, the signal line 404a of the dummy operation request generation necessity judging mechanism 40 is connected to the signal line 650 of the operation request issue control mechanism 60, and as shown in FIGS. 4 and 5, a signal 404a output from the dummy operation request generation necessity judging mechanism 40 is supplied as a suppression condition to the AND circuits 610 to 617 of the operation request issue control mechanism 60. In this manner, issuing a succeeding normal access request can be suppressed if the bank operation number becomes larger than the operation bank limit number.

In the first embodiment shown in FIG. 1, an abrupt change in the power supply current amount is suppressed while a predetermined number of banks are always maintained in operation at a minimum. With this method, however, even if there is no normal access, a number of dummy operation requests are issued to increase the current amount, resulting in wasteful power consumption. In contrast, in the second embodiment shown in FIG. 7, the bank operation number set value (operation bank limit number) itself is dynamically changed. Therefore, even if there are a small number of normal access requests, wasteful power consumption can be avoided.

As described above, in the second embodiment, the number of banks actually operating (operation bank limit number) is dynamically changed with the number of access requests to thereby suppress an abrupt change in the power supply current amount of the main storage device. If the number of normal access requests is increasing, the operation bank limit number is automatically decreased. Therefore, even if the number of access requests becomes small, wasteful power consumption can be avoided.

Figure 9:
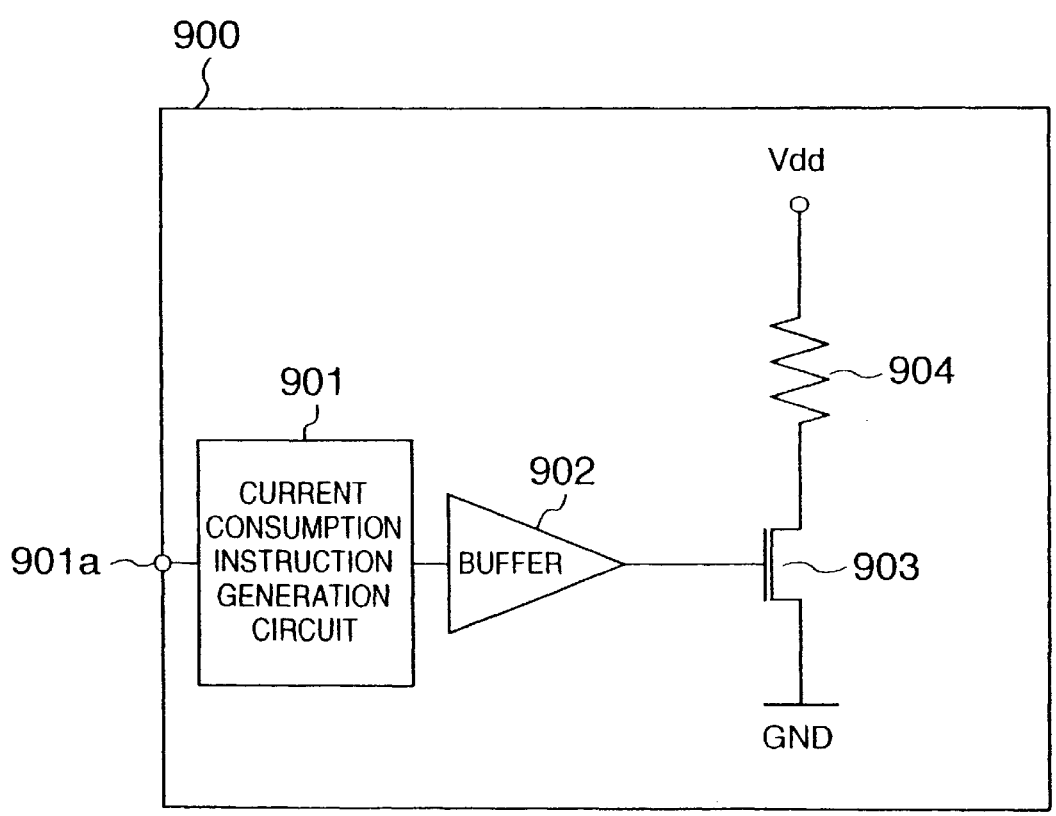
FIG. 9 is a circuit diagram showing an example of the structure of a dummy operation execution mechanism provided with a dedicated current consumption circuit used by the invention.

FIG. 9 shows an example of a dummy operation execution mechanism 900 for a memory cell unit constituting the main storage device. If a DRAM is used as a memory cell unit, the refresh operation characteristic to DRAM may be used for the dummy operation. Namely, a memory cell unit is accessed by using a combination of a RAS signal and a CAS signal, without destructing the information stored in the memory cell unit. With this method, it is not necessary to prepare a specific mechanism for the dummy operation of a memory cell unit. However, the refresh operation occupies the number of cycles approximate to that of a normal read operation. Therefore, if a normal access request is issued, it becomes necessary to wait until the refresh operation is completed. This may lead to a lowered system performance.

Figure 12:
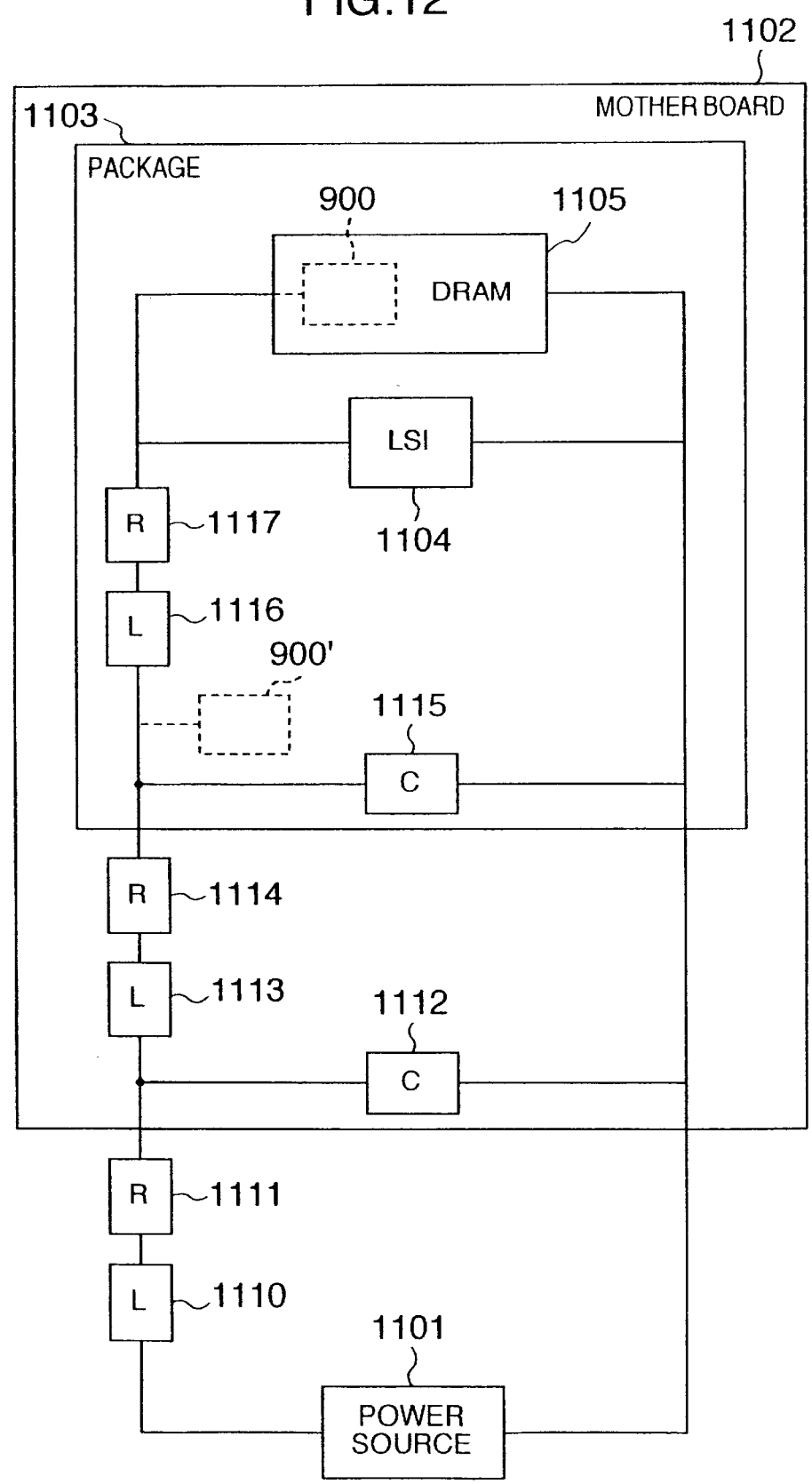
FIG. 12 is a diagram showing a power supply system for supplying power to an electronic circuit group.

In contrast, the mechanism 900 shown in FIG. 9 operates to directly consume current by activating a dedicated power consumption bus upon reception of a dummy operation instruction at a dedicated signal pin 901a. In FIG. 9, a dummy operation instruction is supplied via a current consumption instruction generation circuit 901 to a buffer circuit 902 to thereby turn a transistor 903 on. While this transistor 903 turns on, current flows via a resistor 904 between a power source Vdd and the ground GND, and current consumption can be controlled in the short time duration unit. Therefore, it is not necessary to wait for the completion of a succeeding dummy operation for an excessively long time and the system performance can be prevented from being lowered. The dummy operation execution mechanism 900 shown in FIG. 9 is assumed to be implemented in a memory cell unit. However, as shown by a broken line 900' in FIG. 12, this mechanism may be provided outside of the storage device 1105 and on the power source side. In this case, a general memory cell unit (e.g., DRAM) may be used.

In the embodiments shown in FIGS. 1 and 7, it is assumed that the mechanism is always operating which suppresses an abrupt change in the power supply current amount of the main storage device. In an actual system, however, spontaneously occurring concentration of access requests can be dealt with by using capacitors or the like described with FIG. 12. A significant case occurs if access concentration continues for a long time. If the long access concentration period is detected and the mechanisms shown in FIGS. 1 and 7 are used only during this period, the system efficiency can be improved. Examples realizing this mechanism are shown in FIGS. 10A and 10B.

Figure 10A:
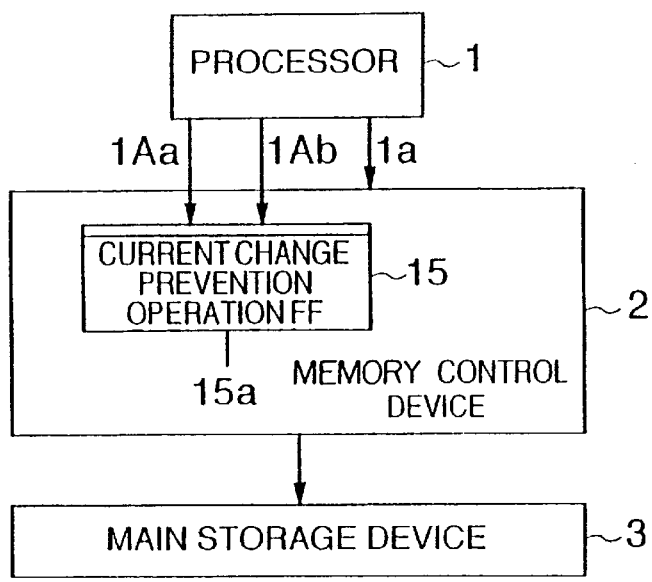
FIGS. 10A and 10B are diagrams showing examples of a current change prevention mechanism.

FIG. 10A shows an example of the system configuration in which a processor 1 directly sets a current change prevention operation flip-flop 15 provided in a memory control device 2. The flip-flop 15 is set by an address signal line 1Aa and a data signal line 1Ab upon an instruction of a program running on the processor 1. Reference numeral 1a represents an access request line. The program executes a procedure of setting the flip-flop 15 prior to the start of a long access request concentration operation, and releasing the set state after the completion of the long access request concentration operation. An output (current change prevention operation signal) 15a of the current change prevention operation flip-flop 15 is supplied to the AND circuits 403 and 404 of the dummy operation request generation necessity judging mechanism 40 shown in FIG. 4. Specifically, if the output 15a of the flip-flop 15 is "0", both the dummy operation generation request signal 403a and access request inhibition signal 404a shown in FIG. 4 are disabled, whereas if "1", these signals 403a and 404a are enabled.

Figure 10B:
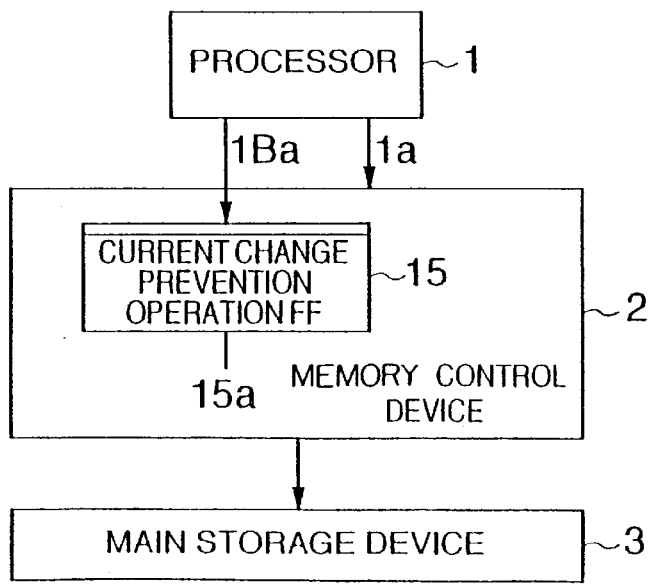

FIG. 10B shows an example of the configuration in which a long access concentration period is detected with hardware. For example, if a processor 1 starts a "pseudo vector" process, the operation mode in the processor 1 changes. This mode change is supplied via a signal line 1Ba to a current change prevention operation flip-flop 15 in a memory control device 2. It becomes therefore possible to enable the mechanism for suppressing an abrupt change in the power supply current amount of the main storage device 3, before the long access concentration operation.

With the configurations shown in FIGS. 10A and 10B, it becomes possible to enable the mechanism for suppressing an abrupt change in the power supply current amount of the memory control device 2 only during the long access concentration period. Therefore, a consumption current amount can be controlled while suppressing excessive power consumption.

In the above description, the processor, memory control device and main storage device are mainly structured by using discrete components. However, in the current circumstances with advanced high integration, most of circuits are made of LSIs. For example, the processor 1, memory control device 2 and main storage device 3 surrounded by broken-line frames 5 and 5' shown in FIGS. 1 and 7 may be implemented on a single semiconductor chip, or the memory control device 2 and main storage device 3 surrounded by two-dot chain line frames 6 and 6' shown in FIGS. 1 and 7 may be implemented on a single semiconductor chip. The invention is also applicable to such cases, because a large change in a power supply current amount may affect such a single semiconductor chip more than a printed circuit board mounting semiconductor devices or the like. This is because capacitors cannot be implemented on a semiconductor chip more than a printed circuit board, a semiconductor chip has inductance of a power supply system more than a printed circuit board, and other reasons. The present invention provides effective mechanisms also for stably operating a highly integrated semiconductor chip.

In FIGS. 1 and 7, each mechanism 20, 30, 40, 50, 60 is shown and described discretely. Part or the whole of these mechanisms may be integrated as desired without departing from the aspects of the present invention. A device to be controlled is not necessarily limited to a main storage device, but other storage devices may be controlled.

What is claimed is:

1. An information processing system having a processor, a memory control device, and a storage device including a plurality of independently operating memory banks, said information processing system comprising:

means for storing an operation bank limit number of memory banks in said storage device required to operate at a minimum;

means for counting an operation bank number of memory banks under operation in said storage device; and means for instructing said storage device to execute a dummy operation, when said operation bank number is smaller than said operation bank limit number.

2. The information processing system as claimed in claim 1, further comprising:

means for invalidating an issue of a dummy operation request to said storage device or an issue of a succeeding normal access request to said storage device, in accordance with process contents of said processor.

3. The information processing system as claimed in claim 1, wherein said storage device instructed to execute a dummy operation executes a current consumption operation without destructing information stored in said storage device.

4. The information processing system as claimed in claim 3, wherein said storage device includes dynamic random access memories (DRAMs), and the current consumption operation is a refresh operation of the DRAMs.

5. The information processing system as claimed in claim 3, further comprising means for executing the current consumption operation in response to a signal instructing the dummy operation, provided at a power source input terminal of a memory cell unit of each memory bank.

6. The information processing system as claimed in claim 1, wherein at least said storage device and said memory control device are integrated on a single semiconductor chip.

7. An information processing system having a processor, a memory control device, and a storage device including a plurality of independently operating memory banks, said information processing system comprising:

means for storing an operation bank limit number of memory banks in said storage device required to operate at a minimum;

means for counting an operation bank number of banks under operation in said storage device; and means for instructing said storage device to execute a dummy operation when said operation bank number is smaller than said operation bank limit number, and inhibiting an issue of a succeeding normal access request to said storage device when said operation bank number is not smaller than said operation bank limit number.

8. The information processing system as claimed in claim 7, further comprising:
means for invalidating an issue of a dummy operation request to said storage device or an issue of a succeeding normal access request to said storage device, in accordance with process contents of said processor.

9. The information processing system as claimed in claim 7, wherein said storage device instructed to execute a dummy operation executes a current consumption operation without destructing information stored in said storage device.

10. The information processing system as claimed in claim 9, wherein said storage device includes dynamic random access memories (DRAMs), and the current consumption operation is a refresh operation of the DRAMs.

11. The information processing system as claimed in claim 10, further comprising means for executing the current consumption operation in response to a signal instructing the dummy operation, provided at a power source input terminal of a memory cell unit of each memory bank.

12. The information processing system as claimed in claim 10, wherein at least said storage device and said memory control device are integrated on a single semiconductor chip.

13. A method of controlling the operation of a storage device of an information processing system, comprising:
determining an operation bank limit number of memory banks in said storage device required to operate at a minimum;
counting an operation bank number of memory banks under operation in said storage device; and
instructing said storage device to execute a dummy operation if said operation bank number is smaller than said operation bank limit number.

14. The method as claimed in claim 13, further comprising:
inhibiting an issue of a succeeding normal access request to said storage device if said operation bank number becomes larger than said operation bank limit number; and
increasing a value of said operation bank limit number even if a single dummy operation request is not issued during a predetermined period, and decreasing the value of said operation bank limit number if at least one dummy operation request is issued during said predetermined period, respectively at an interval of said predetermined period.

15. An information processing system, comprising:
a processor;
a storage device including a plurality of independently operating memory banks; and
a memory control device which handles access requests from said processor to said storage device and which controls a change in a power supply current amount of said storage device in response to the number of access requests from said processor to said storage device, said memory control device determining a number of memory banks under operation, making a comparison between the number of memory banks from said storage device under operation the an operation bank limit number, instructing said storage device to execute a dummy operation and inhibiting succeeding requests for access to said storage device in accordance with said comparison.

16. The information processing system as claimed in claim 15, wherein said memory control device instructs said storage device to execute said dummy operation if the number of memory banks under operation is smaller than the operation bank limit number, and inhibits succeeding requests for access to said storage device if the number of memory banks under operation becomes larger than the operation bank limit number.

17. The information processing system as claimed in claim 15, wherein said memory control device comprises:
a status management mechanism which manages an operation status of each memory bank of said storage device;
a bank operation counting mechanism which receives operation status information and access request information of each memory bank and determines the number of memory banks under operation; and
a dummy operation generating mechanism which compares the number of memory banks under operation with the operation bank limit number, which generates a dummy operation request for enabling execution of said dummy operation if the number of memory banks under operation is smaller than the operation bank limit number, and which generates an access inhibition request for inhibition of succeeding requests for access to said storage device if the number of memory banks under operation becomes larger than the operation bank limit number.

18. The information processing system as claimed in claim 15, wherein said memory control device further comprises a memory bank operation set value mechanism which changes a set value of the operation bank limit number in accordance with the number of dummy operation requests issued during a predetermined period.

19. The information processing system as claimed in claim 18, wherein said status management mechanism comprises a plurality of counters each of which manages the operation status of a corresponding memory bank of said storage device in accordance with the access requests issued from said processor to said storage device.

20. The information processing system as claimed in claim 18, wherein said bank operation counting mechanism comprises a plurality of OR gates each of which logically combines the operation status information and the access request information of each respective memory bank, and a counter which determines the number of memory banks under operation.

21. The information processing system as claimed in claim 18, wherein said storage device executes a current consumption operation without affecting information stored in said storage device during said dummy operation.

22. The information processing system as claimed in claim 21, wherein said memory banks of said storage device correspond to dynamic random access memories (DRAMs), and said current consumption operation corresponds to a refresh operation of the DRAMs.

23. The information processing system as claimed in claim 15, wherein said storage device and said memory control device are integrated on a single semiconductor chip.

* * * * *